United States Patent [19]

Bille et al.

[11] Patent Number: 4,727,381
[45] Date of Patent: Feb. 23, 1988

[54] APPARTUS FOR, AND METHODS OF, INSCRIBING PATTERNS ON SEMICONDUCTOR WAFERS

[76] Inventors: Josef Bille, Am Pferchelhang 2/4; Siegfried Hunklinger, Am Büchsenackerhang 68, both of 6900 Heidelberg, Fed. Rep. of Germany

[21] Appl. No.: 758,061
[22] Filed: Jul. 23, 1985
[30] Foreign Application Priority Data Jul. 25, 1984 [DE] Fed. Rep. of Germany ....... 3427611

[51] Int. Cl.$^4$ .......................... G01D 9/42; G11B 7/00
[52] U.S. Cl. ........................................ 346/108; 369/44; 369/116
[58] Field of Search ................ 346/108, 107 R, 76 L; 351/221; 356/394; 369/116, 106, 44

[56] References Cited

U.S. PATENT DOCUMENTS

| 4,001,840 | 1/1977 | Becker et al. | 346/108 |
| 4,293,202 | 10/1981 | Ohnishi et al. | 346/108 |
| 4,486,791 | 12/1984 | Wada et al. | 369/44 |

Primary Examiner—E. A. Goldberg
Assistant Examiner—Mark Reinhart
Attorney, Agent, or Firm—Ellsworth R. Roston; Charles H. Schwartz

[57] ABSTRACT

An energy (i.e. laser) beam directed to a photoresist layer is scanned in a first direction through lines progressively displaced in a second coordinate direction. In this way, stripe areas of a wafer are exposed sequentially in a first direction with a thickness dependent upon the size of the laser spot focussed on the beam. The beam scanning rate is adjustable to obtain a time coincidence between the occurrence of markers in a computer and the scanning of a particular position in each line. The beam is modulated during the scan to inscribe a pattern on the layer. The beam is focussed on, and reflected from, the photoresist layer. The reflection is used to maintain the focussing of the beam on the layer by adjusting individual elements in an active mirror in accordance with the reflected beam characteristics. The beam may be split into a plurality of beams displaced from one another in the first direction by providing associated pairs of spherical facets in a lens system and directing portions of the beam between the facets in each pair. Such beams are synchronously scanned to increase the scanning frequency. A second beam with different characteristics than the first beam may be scanned asynchronously (e.g. a reduced speed) relative to the first beam and may be focussed on the photoresist layer in a manner similar to that described above. Light reflected in the second beam from the layer is used to adjust the characteristics of the individual elements in the active mirror so as to maintain the beam focussed on the photoresist layer.

40 Claims, 5 Drawing Figures

APPARTUS FOR, AND METHODS OF, INSCRIBING PATTERNS ON SEMICONDUCTOR WAFERS

This invention relates to a system which uses a laser to inscribe a pattern directly on a substrate. The invention also relates to methods of inscribing a pattern on a photoresist layer on a substrate. The invention is intended to be used primarily for the production of large-scale integrated circuits.

In lithographic systems, a laser beam is used to print a desired microstructure on a photosensitive resist layer disposed on a substrate. In such systems, a master beam is split into a multiple number of beams to reach a high working frequency by opposing an increased number of such beams on the photoresist layer. Such a laser-beam writer has been developed and marketed by TRE Semiconductor Equipment Corporation, California, USA.

One of the disadvantages of the TRE laser-beam writer is that focussing of all beams is only possible at one single focal plane. Thus, the use of such writers is, apart from mask production, feasible only if a so-called two-level resist strategy is applied. In such a strategy, a thick resist layer compensates for the rough wafer surface. This thick resist layer is then covered by a relatively thin layer on which the desired pattern is then written. As will be seen, this system is cumbersome and expensive. Another disadvantage of such laser-beam lithography is that each of the light beams in the plurality has to be conducted in optical paths of the same length to guarantee focussing on one planar surface. This has to occur because beam control can be obtained only with a single reflector.

The technological effort required to operate a laser-beam writer as described in the previous paragraphs is considerable. For example, functional adjustments of the beam writer are difficult and can be provided only by specialists. Thus the employment of laser-beam lithography as described above has so far been restricted to laboratory use only. Furthermore, the writer is limited in its printing speed since the deflection unit in the writer limits the writing speed to approximately ten megahertz (10 mhz).

Electron-beam writers used for the production of integrated circuits provide a working frequency to twenty megahertz (20 mhz). However, such writers require large-scale vacuum installations and complex control systems. These are expensive and are susceptible to failure.

A considerable effort has been made to provide a system which employs a laser to write on a substrate and which overcomes the disadvantages specified in the previous paragraphs. In spite of such efforts, the laser writers now in use still have the disadvantages specified above. Thus one aim of the invention is to provide a pattern generator which uses a laser and which operates at a high frequency and has a compact and simple construction and a reliable operation to provide a direct exposure of the wafer surface.

The pattern generator of this invention provides a writing speed in the order of forty megahertz (40 mhz) and thus a reduction of the total exposure period by half in comparison to an electron-beam lithographic writer and by a quarter in comparison to laser-beam writers offered by TRE. The laser-beam writer according to this invention requires only a minimal adjustment and can be easily adjusted when needed. It also provides an automatic refocussing for laser spot to control the size of the spot within optimal limits. Accuracy of the patterns to be printed by exposing photosensitive resists is thus considerably enhanced.

The laser pattern generator of this invention may be provided in the form of a multi-channel system which provides for an increase in the operating speed by a factor corresponding to the number of channels provided in the system. These channels are obtained from a single light beam and are synchronously scanned.

A pattern is inscribed on a photoresist layer on a substrate by directing an energy (i.e. laser) beam to the layer. The beam is scanned in a first direction through lines progressively displaced from one another in a second coordinate direction. In this way, stripe areas of a wafer are exposed sequentially in a first direction by the system of this invention. The thickness of the stripe areas is dependent upon the size of the laser spot focussed on the beam.

The scanning rate of the beam is adjustable to obtain time coincidence between the ocurrence of markers in a computer and the scanning of a particular position in the progressive lines. The beam is modulated during the scan to inscribe the pattern on the layer. The substrate may also be moved in the co-ordinate directions to facilitate the scan.

The beam is focussed on, and reflected from, the photoresist layer. The reflection is used to maintain the focussing of the beam on the layer. This may be accomplished by providing an active mirror with a plurality of individual elements and adjusting the individual elements in accordance with the characteristics of the reflected beam.

The beam may be split into a plurality of beams displaced from one another in the first direction. This may be accomplished by providing associated pairs of spherical facets in a lens system and by directing portions of the beam between the facets in each pair. The beams in the plurality are synchronously scanned to increase the scanning frequency.

A second beam may be provided with different characteristics than the first beam. The second beam may be scanned asynchronously with the first beam such as at a lower speed than the first beam and may be focussed on the photoresist layer in a manner similar to that described above. Light reflected in the second beam from the layer is used to verify the pattern inscribed on the layer by the first beam.

This application corresponds to an application Ser. No. P34 27 611.4 filed by applicants in the Federal Republic of Germany on July 25, 1984. Applicants accordingly claim the benefit of the Convention date of July 25, 1984. Furthermore, the apparatus disclosed and claimed in this application is similar in several respects to apparatus disclosed and claimed in application Serial No. 706,619 filed by Josef Bille in the U.S. Patent Office on Feb. 28, 1985, and application Ser. No. 742,531 filed by Josef Bille and Siegfried Hunklinger in the U.S. Patent Office on June 7, 1985.

Further details and elements of the invention derive from a subsequent description of several different embodiments which are shown in the drawings.

In the course of producing large-scale integrated circuits on substrates on wafers such as a substrate 11, the integrated circuits are illustratively produced by a variety of single-process steps. In at least some of these steps, a photoresist covers the microstructured surface of the substrate 11 and is prepared for exposure to sputtering, diffusion, implantation and/or oxidation processes. Such exposure may be provided by using a system, generally indicated at 10, to inscribe the surface of the photoresist layer. After such exposure, either the exposed or the unexposed portions of the photoresist layer may be removed from the substrate 11. The resist remaining on the substrate 11 is then used as a mask during the following process steps.

In one expedient utilization, the photo-resist can also be used as a base for another layer, e.g. a conducting metal-film. Under such circumstances, the respective areas of the additional layer and the exposed or unexposed areas of the resist (according to resist type) may be removed as by etching. The laser pattern generator 10 of this invention provides an accurate exposure of the respective resists for the production steps and provides such exposures faster and more accurately and reliably than that provided in the prior art.

Figure 1:
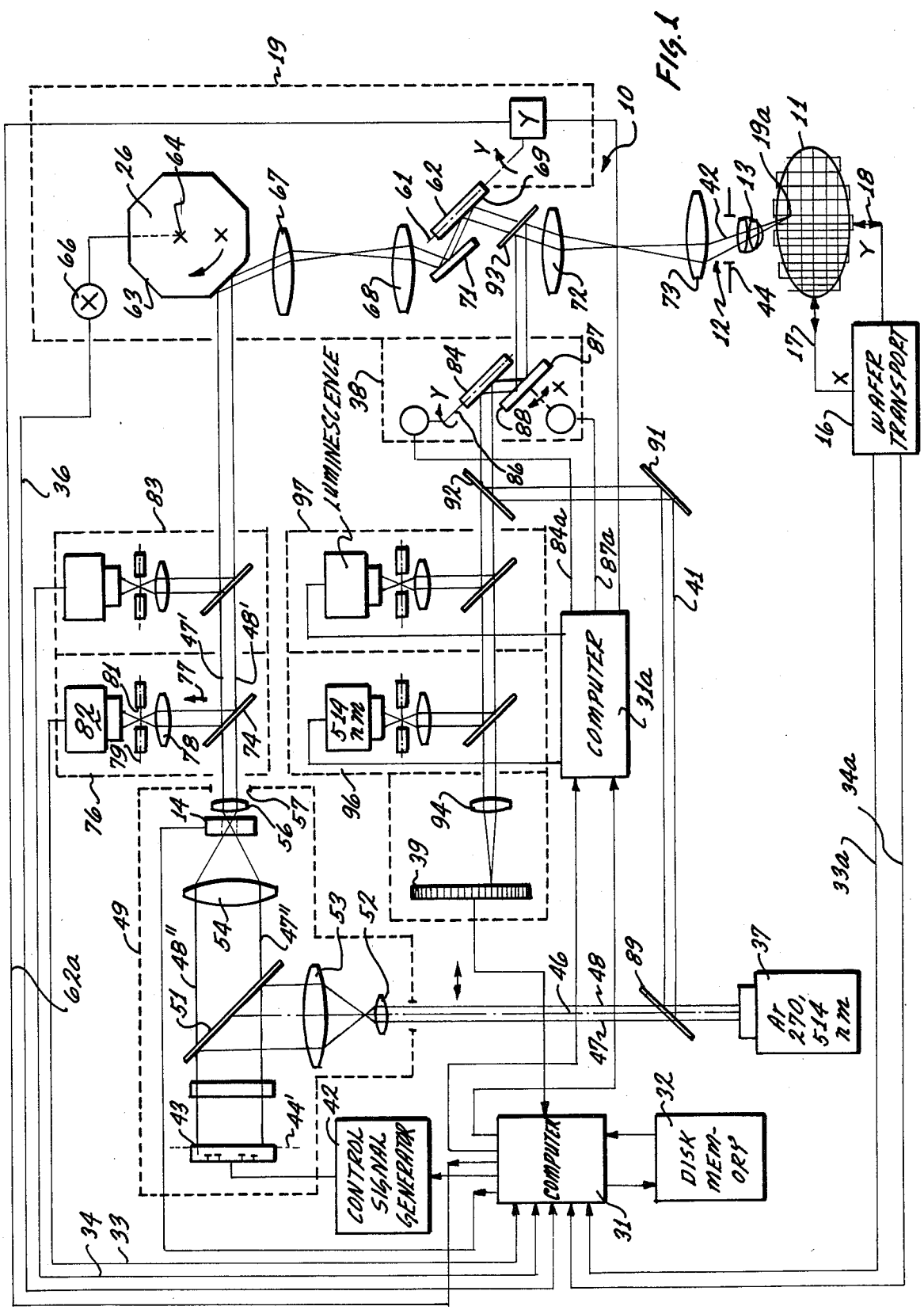
FIG. 1 is a block diagram of a single channel system for inscribing a pattern on a photoresist layer on a substrate.

The system 10 shown in FIG. 1 constitutes a single-channel system, where only one laser beam 12 is used to expose the photoresist layer. This laser beam is focussed on the surface of the photoresist layer on the substrate or wafer 11 by means of a microscope objective 13. The laser beam 12 is focussed on the wafer as a wafer spot which has a representative diameter of approximately one quarter of a micrometer (0.25 $\mu$m) in accordance with the half-width value of the Gaussian intensity profile of a laser beam.

The intensity of the laser beam may be altered in a ratio to 500-1 by means of an acousto-optical modulator 14. If required, the intensity can be fine-tuned. The substrate 11 can be moved by a conveyor 16 (only schematically outlined) to-and-fro along an x-coordinate and a y-coordinate respectively marked by arrows 17 and 18 to expose the full surface of the photoresist layer of the substrate 11.

Figure 2:
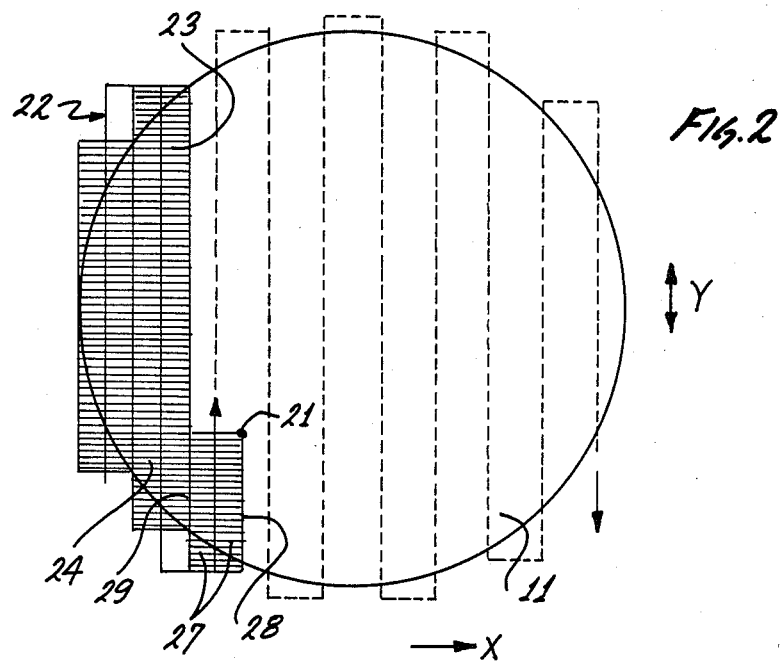
FIG. 2 is a diagram schematically illustrating how the photoresist layer is scanned by the system of FIG. 1 to inscribe the pattern on the layer.

An optical scanner (indicated in broken lines as a block 19) is included to provide a horizontal sweep of the laser beam in the x-direction. This beam is focussed by the microscope objective 13 to provide a laser spot 21 (FIG. 2) with a field size in the order of two hundred and fifty micrometers (250 $\mu$m). In the exposing process, the substrate 11 is moved past the microscope objective 13 by a conveyor 16 on a meander- or square-wave path illustrated by full and dotted lines in FIG. 2. Typical feed rates in the y-direction are between one millimeter per second (1 mm/s) and five millimeters per second (5 mm/s). At the same time, the laser spot moves with a considerably higher rate in the x-direction, i.e. with a rate of five meters per second (5 m/s). Because of the simultaneous movement of the substrate 11 and the scanning of the laser beam, the laser beam covers a band area 24 while the substrate 11 moves along an area 23 of a meander path generally indicated at 22. By providing an appropriate adjustment of the sweep rate of the laser beam in the x-direction and the feed rate of the substrate in the y-direction, the band area 24 can be fully exposed. By exposing successive ones of the band areas 24, the full area of the photoresist layer on the substrate 11 may be fully exposed.

Line control is achieved, in the system shown in FIG. 1, by a rotatable motor-driven polygonal mirror 26. As a result, the laser spot 21 moves in parallel lines 27 (FIG. 2) from one edge to an opposite edge 29 of each band 24. Because of the special layout of the conveyor for the substrate 11, the feed rate of the substrate 11 in the y-direction can be adjusted so that the distance in the y-direction of pairs of successive lines is equal to substantially the radius of the laser spot 21. Thus, the distance measured between the lines in each successive pair is in the order of one eighth of a micrometer (0.125 $\mu$m) in the example discussed above.

The acousto-optical modulator 14 controls intensity—i.e. brightness—of the laser-beam 12. The modulator 14 can be stimulated by a forty megahertz (40 mhz) signal. In other words, the intensity of the laser beam 12 can be adjusted forty million different times within one second. If, in each line 27, two thousand (2,000) scanning points are to be exposed, their distance relative to one another in the x-direction is one eighth of a micrometer (0.125 $\mu$m). This means that twenty thousand (20,000) lines 27 can be exposed point-by-point per second, where the distance between the lines is also one eighth of a micrometer (0.125 m). Thus, a dot-responsive line scanning pattern is obtained for exposure where the dots are equidistant in both the x-direction and the y-direction.

The pattern to be produced by exposure of the photoresist on the substrate 11 may be stored on a disk memory connected to a computer 31. During exposure of the photoresist, this pattern can be sequentially read from the computer 31 and then processed by the computer for appropriate control of the acousto-optical modulator 14. During this process, the movement of the substrate 11 is synchronized with the signals from the computer 31 by signals received from the conveyor 16. These signals provide information to the computer 31 about the position of the substrate 11 at each instant. This synchronization is provided by the introduction of signals to the computer 31 through lines 33, 34 and 36. The signals on the line 36 indicate the rate at which the laser beam is being swept in a horizontal direction. The signals on the lines 33 and 34 indicate the rate at which output signals are obtained from the surface of the substrate 11 as a result of the passage of the laser beam to the substrate. The computer 31 then processes these signals and introduces signals to the conveyor 16 through lines 33a and 34a to control the subsequent operation of the conveyor.

For exposing the photoresist on the substrate 11, an ionized argon-laser 37 may be used to emit an ultra-violet (UV) light band of approximately $\lambda_1 = 270$ nm. The standard type of photoresists on the substrate 11 are sufficiently sensitive to ultraviolet light at this wavelength. The laser also emits a light band of approximately $\lambda_2 = 514$ nm. This light band is used by another laser scanner (generally indicated in broken lines at 38), also working as a laser scanning microscope, for covering a so-called point-spread-function, i.e. the spatial distribution of the intensity of the light reflection in selected spots or areas of the substrate surface. The scanner 38 is driven asynchronously with respect to the scanner 19 such as at a considerably reduced scanning frequency than that of the scanner 19. The light reflected from the surface of the substrate 11 into the path of the scanner 38 is received in its two-dimensional-spatial distribution of intensity by photoelectric sensors 39 disposed in two dimensions in a matrix relationship. The sensors may preferably comprise diodes.

The intensity distribution of the portion of the light beam reflected from an exposed surface element on the photoresist surface of the substrate 11 is stored for further processing. A comparison can be made between the stored intensity distribution of the light beam and an ideal point spread function to obtain precise focussing of the scanning beam, schematically designated at 41 in FIG. 1, on the scanned surface of the substrate 11. This precise focussing can be obtained by the use of known algorithms which will be further explained subsequently. If the measured point-spread function differs from the ideal point-spread function, a control signal transmitter 42 connected to the computer 31 is activated to produce output signals which control a so-called active mirror 43, i.e. a mirror whose focal power can be controlled electrically. The active mirror 43 produces a compensating focus adjustment in the path of the exposing beam 12 of the laser pattern generator 10, so that the exposing laser beam 12 is focussed on the photosensitive surface of the photoresist layer accurately within predetermined tolerances. Thus, successive automatic readjustments of the exposing beam spot 12 on the surface of the photoresist layer can be achieved during exposure of the photoresist layer. It will be appreciated that not every point to be exposed can be thus adjusted. Illustratively, this adjustment can be provided only once per scanned line 27 (FIG. 2) because processing of the point-spread-function requires a certain amount of time.

Figure 3:
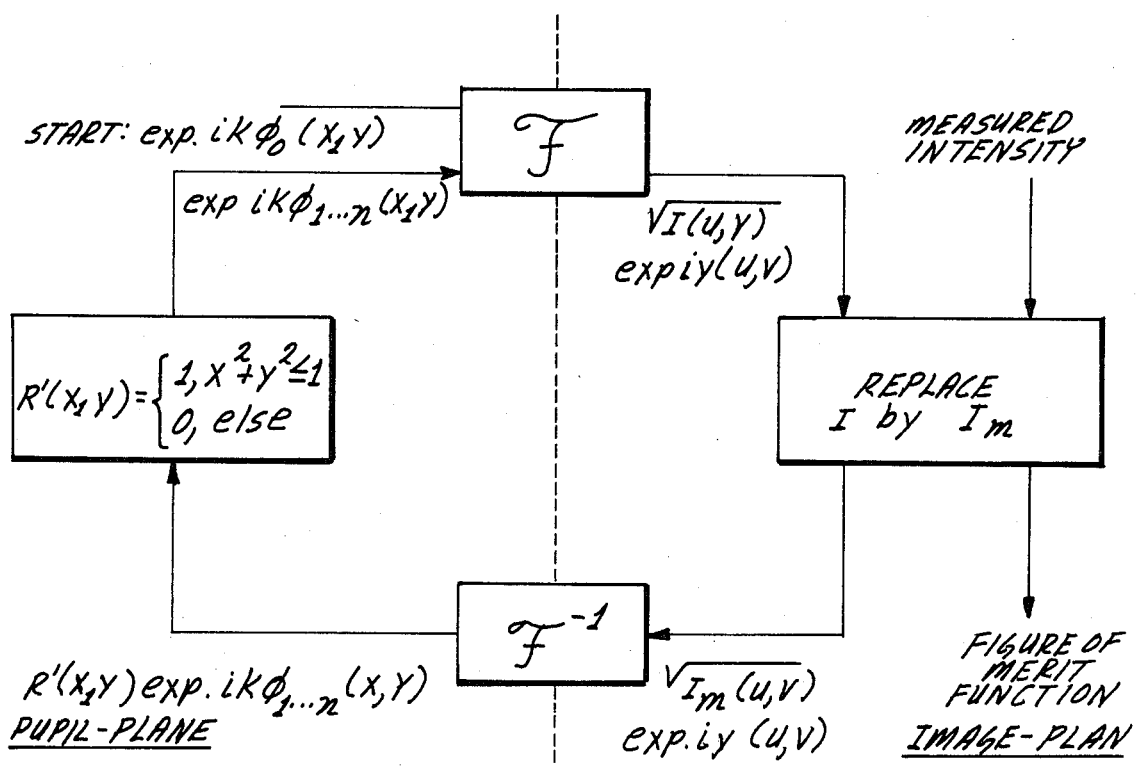
FIG. 3 is a block diagram of an electrical sub-system which may be included in the system of FIG. 1 to automatically refocus a beam on the photoresist layer to inscribe the pattern on the layer.

Reference is now made to FIG. 3, which is a schematic representation of a computational procedure for processing in the computer 31 the data relating to the point-spread function. This procedure basically consists in producing an iteration in which the intensity distribution (of the point-spread function) IM (u, v) (u = line index, v = column index of the active mirror 43) is used to calculate, for the plane of the entrance pupil 44 of the microscope objective 13, a shape of the wavefront of the scanning light. This shape is consistent with the detected intensity distribution Im (u, v). As a reasonable initial condition, no deformation occurs in the focal plane and the radiation field at the location (x, y) of the entrance pupil 44 of the microscope objective 13 has a plane wavefront which is characterized by a phase factor $\phi$ (x, y).

The transfer function of the optical system includes a typical structure of that part of the examination object to which the scanning light beam passes, i.e. the light distribution in the image plane is derived by a convolution of the wavefront R(x,y) . exp ik $\phi$ (x,y) with the transfer function. In consideration of such transfer function, the shape of the radiation (light)-field $\sqrt{I(u, v)}$ exp i$\gamma$ (u,v) in the focal plane of the microscope objective 13 is calculated. The amplitude factors $\sqrt{I(u, v)}$ may be replaced by the values $\sqrt{Im (u, v)}$. Such values may be obtained from the intensity measurements and from the application of the inverse transfer function $F^{-1}$ to the shape of the radiation light-field in the focal plane of the microscope objective 13. By replacing the amplitude factors $\sqrt{I(u, v)}$ by the values $\sqrt{Im(u, v)}$, a shape of the wavefront at the entrance pupil 44 of the microscope objective 13 is calculated which is consistent with the set-up field-shape. This shape has a phase factor $\phi_1(x, y)$ consistent with the set-up field-shape.

In a first iteration step, the phase factor $\phi_1(x, y)$ is set up for a mathematical description of the radiation field at the location of the entrance pupil 44. The radiation field in the focal plane of the microscope objective 13 is again calculated. As a result, the amplitude factors are replaced by the square-roots of the measured intensities and a new phase factor $\phi_2$ (x, y) is calculated. Such iteration steps are repeated until the measured intensities agree within tolerable limits with the calculated intensity values. In this way, a wavefront at the position of the entrance pupil 44 of the microscope objective 13 is determined. This wavefront is consistent with the measured intensity values.

By comparing the wavefront shapes resulting from the iteration procedure, the wavefront at the entrance pupil of the microscope objective 13 for an ideal case with control signals can be generated, through the operation of the computer control signal generator 42, for adjusting the active mirror 43. The active mirror 43 is adjusted to make the measured intensity distribution Im (x, y) substantially identical with an ideal intensity distribution in the focal plane of the microscope objective 13. This ideal distribution would result if the radiation field wavefront at the entrance pupil 44 of the microscope objective 13 were ideal.

In this way, the transfer function of the optical system can be adjusted to smooth the focal plane 19a of the microscope objective 13 and to insure that the image information from the scanning sub-assembly 19 corresponds to that which would be obtained under ideal imaging conditions. In other words, the transfer function of the optical system is adjusted to achieve a realistic image of the surface of the photoresist layer on the substrate 11.

The laser pattern generator 10 has so far been described in its general design and its fundamental functions. It is further characterized by the detailed specifications as set forth below for the construction and operation of the system 10.

The master beam of the ionized argon laser 37 is illustrated in FIG. 1 by a dash-dotted main beam 46 and branches 47 and 48. The master beam is basically a parallel beam of rays with a cross sectional area of approximately one square millimeter (1 mm$^2$). The master beam is formed into a beam by an optical system (indicated in broken lines at 49), which contains the active mirror 43. The diameter of the beam produced by the optical system 49 is selected for further optical processing as well as a concerted refocussing—and, if necessary, defocussing—of the laser-beam 12 in the area of the photoresist layer to be exposed on the substrate 11. A computer-controllable defocussing of the laser spot 21 can be appropriate if relatively large areas are to be exposed evenly.

The active mirror 43 is arranged in a pupil level corresponding to the level of the entrance pupil 44 of the microscope objective. The active mirror 43 receives the light reflected from a semi-reflecting mirror 51, which receives the beam 46, 47, 48 passing from the laser 47 through the focussing lenses 52 and 53 and the semi-reflecting mirror 89. The lenses 52 and 53 are provided with different focal distances and are included as a telecentric arrangement in the optical system 49.

Figure 4:
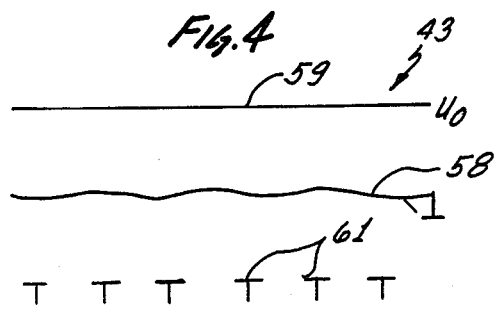
FIG. 4 is a simplified partial display of an active mirror which is included in the system of FIG. 1 and which can be electrically stimulated to enhance the focussing of the beam on the photoresist layer.

The general construction of the active mirror 43 is schematically shown in FIG. 4. The active mirror 43 includes a grounded and metallized film 58 disposed between a transparent backplate electrode 59 and an arrangement formed by a plurality of individual electrodes 61, each of which can be independently stimulated. The backplate electrode 59 is maintained at a constant potential $U_0$. By introducing different potentials to the individual electrodes 61, localized electrostatic forces are produced between the individual electrodes and the backplate electrode 59. These forces affect the deformation of the film 58 at individual positions so that the active mirror 43 provides a positive or negative focal power at these individual positions in accordance with the deformation of the film 58. In this way, the focal power of the active mirror 43 can be individually adjusted at the different positions.

The light beam reflected by the active mirror 43 is represented by branches 47" and 48" in FIG. 1. This light beam passes through the semi-reflecting mirror 51 and is then shaped by a telecentric arrangement of lenses 54 and 56 into a diameter suitable for the laser beam which is being directed to the substrate 11. The acousto-optical intensity modulator 14 is disposed in the joint focal plane of the lenses 54 and 56. The laser beam having a diameter represented by branches 47' and 48' emerges at the opening 57 of the beam-forming optical system 49.

The output beam 47', 48' of the beam-forming optical system 49 in FIG. 1 is introduced to the scanner 19 (shown in broken lines in FIG. 1), which transfers the horizontal sweep of the laser beam 12, i.e. the laser spot, in the x-direction by rotation of the polygonal mirror 26. The polygonal mirror 26 is represented in FIG. 1 with only eight (8) facets 63. However, in a typical form of realization, the polygonal mirror 26 has twenty four (24) equal facets in a polygonal arrangement. The mirror 26 is pivotable by a motor 66 on an axis 64 in a vertical position in relation to the plane of FIG. 1. The laser spot 21 may also be scanned in the y-direction as well as the x-direction by apparatus 62 included within the scanner 19. The apparatus 62 may be in the form of a galvanometer mirror 62 pivotable on a horizontal axis 61.

The facet planes 63 of the polygonal mirror 26 are imaged on a reflecting plane 69 of the galvanometer mirror 62 after passing through a telecentric beam path provided by two lenses 67 and 68. A deflection mirror 71 may be disposed between the exit lens 68 and the galvanometer mirror 62 to achieve a favourable beam-path geometry.

A telecentric lens arrangement of lenses 72, 73 analogous to the telecentric arrangement of the lenses 67, 68 may be included to image the reflecting plane 69 of the galvanometer mirror 72 on the entrance pupil 44 of the microscope objective 13. The telecentric arrangement formed by the lenses 72, 73 focusses the laser light beam 12 as a parallel beam, or a substantially parallel light beam, through the entrance pupil 44 of the microscope objective 13. This light is focussed by the microscope objective on the photoresist layer to be exposed on the substrate 11.

Laser light scattered at the surface of the photoresist layer to be exposed on the substrate 11 is reflected into the beam path described above, including the lenses 73 and 72, the reflecting plane 69 of the galvanometer mirror 62, the lenses 68 and 67 and the polygonal mirror 26. The light is then reflected in the direction of an arrow 77 by means of a partially transparent mirror 74, usually a semi-transparent mirror. The mirror 74 is disposed between the polygonal mirror 26 and the exit 57 of the beam-shaping-optics 49 and is a constituent part of a first detecting arrangement 76 (indicated in broken lines). This light beam is focussed by a microscope objective 78. In the focal plane 79 of ths microscope objective 78, a pinhole 81 is arranged to provide for a limitation of the light beam in so far as it allows only light to pass to a photomultiplier 82 from an area of the focussing plane of the exposure beam-path corresponding to the depth area of the microscope objective 13. The detecting arrangement 76 is designed in a manner such that it reacts to ultraviolet (UV)-light of the wavelength $\lambda_1 = 270$ nm used to expose the photoresist coating on the substrate 11.

By providing the detecting arrangement 76, connection markers may be recognized in the reflected UV-light in order to obtain continuous and precise limits of lines 27 of adjoining striped areas 24. These lines 27 are generated to expose the photoresist coating in narrow overlapping areas of adjoining surface stripes 24 on the substrate 11. To this end, the computer 31 stores the pre-defined areas of such markers. If the recognizing signal produced in the photomultiplier 82 appears at a time different than that defined by the information stored in the computer 31, this indicates that the lines 27 in the striped areas 24 are displaced in relation to the lines of the stripes previously exposed. The computer 31 then generates a signal on a line 62a for the y-deflection apparatus 62 of the first scanner 19. This signal provides for an adjustment of the galvanometer mirror 62 to compensate for the displacement of line 27 in the y-direction. The computer 31 also generates signals on the lines 33a and 34a to regulate the transport of the substrate in the x-direction and in the y-direction.

Analogous to the detecting arrangement 76, a second detecting arrangement 83 (indicated in broken lines) may react to the intensity of the luminescence radiation provided in the substrate 11 after UV-exposure on the photoresist coating on the substrate 11. Markers recognized by the second detecting arrangement 83 may be generated such as by bleaching of the photo-luminescence in partial areas of the surface on the substrate 11.

The second scanner 38 includes, as scanning elements, a first galvanometer mirror 84 pivotable on a horizontal axis, i.e. an axis 86 which is parallel to the propagation plane of the scanning light and which provides for the y-deflection of the scanning light. The scanner 38 also includes a second galvanometer mirror 87 pivotable on an axis 88 which is in a vertical position in relation to the propagation plane of the scanning light. Thus, the galvanometer mirror 87 provides for the x-line-deflection. The light passing to the galvanometer mirrors 84 and 87 is in the form of a light beam 41 having a wave-length of approximately $\lambda_2 = 514$ nm. This light is branched from the output light beam 46, 47, 48 of the argon laser 37 and is indicated at 41 in FIG. 1. The beam 41 is coupled into the beam path provided for the illumination of the substrate 11 via a first mirror 89 (transparent for UV-laser-light and reflecting for the wave-length $\lambda_2 = 514$ nm) a deflecting mirror 91, a partially transparent mirror 92, the second scanner 38 and a partially transparent mirror 93. The mirror 93 is disposed between the galvanometer mirror 62 of the first scanner 19 and the lens 72 of the telecentric lens arrangement 72, 73 which is positioned before the entrance pupil 44 of the microscope objective 13 in the direction of travel of light toward the substrate 11.

The light reflected by the photoresist layer on the substrate 11 from the light beam 41 is reflected by the mirror 93 into the path including the mirrors 87 and 84. The light passes through the mirror 92 and a lens 94 to the diode matrix 39. The signals from the diode matrix 39 are processed by the computer 31 and these processed signals are introduced to the active mirror 43 to optimize the focussing of the light beam on the photoresist layer on the substrate 11.

Additional detecting arrangements 96 and 97 (respectively indicated in block form) may be included which are respectively analogous to the first and second detecting arrangements 76 and 83. The detecting arrangement 96 provides for the recognition of connection markers in the reflected scanning light relative to predefined areas stored in the computer 31. The detecting arrangement 97 provides for the recognition of the reflected luminescence radiation. The signals from the detecting arrangements 96 and 97 are introduced to a computer 31a, the operation of which is synchronized with the computer 31. The computer 31a then processes these signals in a manner similar to the processing by the computer 31 of the signals from the detecting arrangements 76 and 83. The processed signals from the computer 31a are introduced through lines 84a and 87a to the drive members controlling the pivotable disposition of the mirrors 84 and 87 at each instant so that the sweep of the light beam 41 will be synchronized with the markers in the computer 31.

By using the system 10 shown in FIG. 1 and described above, an illumination frequency of forty megahertz (40 mhz) is achievable. In other words, forty million (40,000,000) image points (pixels) per second of an illumination structure may be generated. This is at least twice as great as any frequency generated by comparable equipment in the prior art. Furthermore, by including the controls described above, the system 10 is able to inscribe a very accurate pattern on the photoresist layer on the substrate 11.

Figure 5:
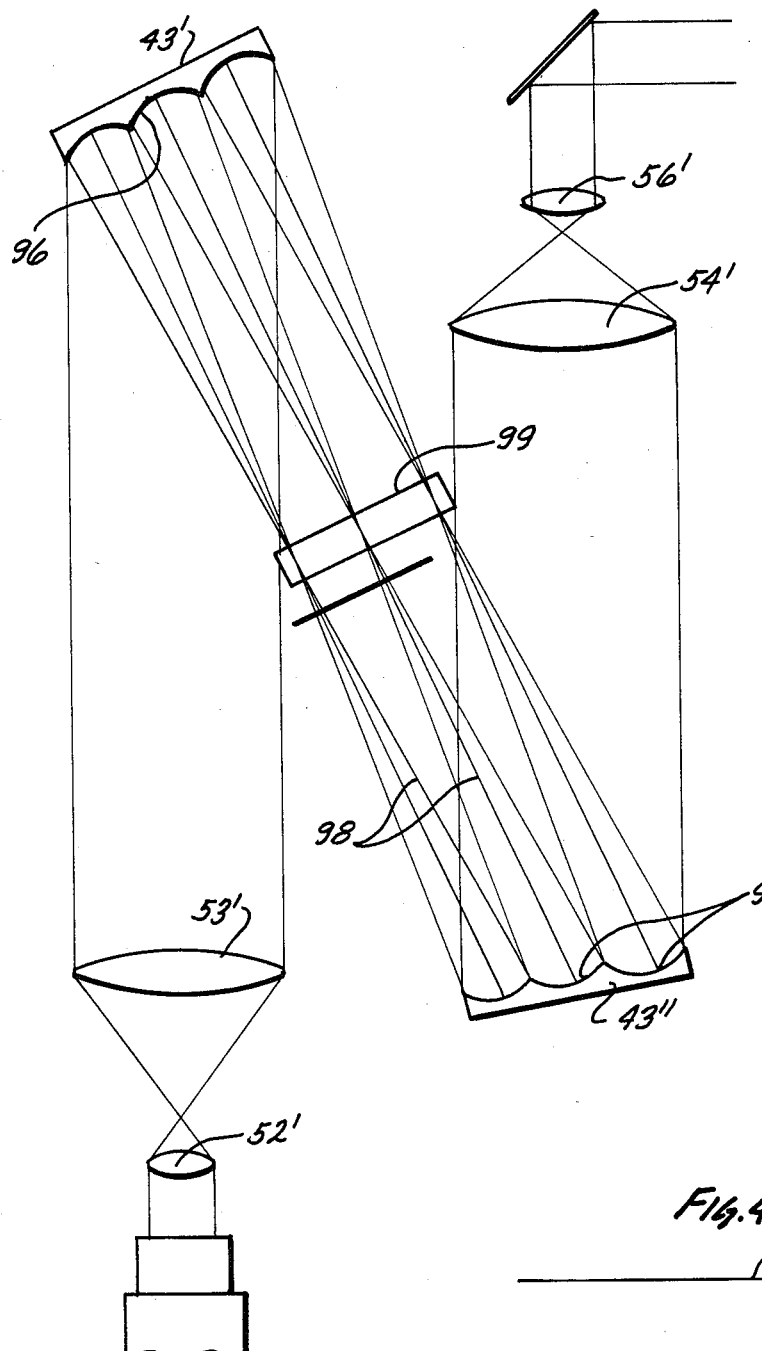
FIG. 5 shows apparatus for converting the single channel system of FIG. 1 into a multi-channel system.

In place of the beam-shaping-optics shown in FIG. 1 for providing a single channel, an alternate embodiment may be provided as shown in FIG. 5 for simultaneously processing a plurality of channels. This embodiment includes a pair of active mirrors 43', 43", each corresponding in construction to the active mirror 43. The active mirrors 43' and 43" are arranged in a z-like beampath, as shown in FIG. 5, between a lens arrangement formed by lenses 52' and 53' and a lens arrangement formed by lenses 54' and 56'. The lenses 52' and 53' respectively correspond to the lenses 52 and 53 in FIG. 1 and the lenses 54' and 56' in FIG. 5 respectively correspond to the lenses 54 and 56 in FIG. 1.

The active mirrors 43' and 43" are shaped as facet mirrors each having a plurality of facets. The mirror 43' has a number of spherical facets 96 corresponding to a number of spherical facets 97 in the active mirror 43". Each individual one of the spherical facets 96 of the active mirror 43' is conjugated with an individual one of the spherical facets 97 of the other active mirror 43" in such a way that each pair of conjugated mirrors possesses a common focus with the central axis 98 of the light beams. In this way, each conjugated pair of facets 96 and 97 acts on an individual light beam. The light beams travel in a z-shaped path between the lenses 52', 53' and the lenses 54', 56' and converge on one of the conjugated pairs of facets 96 and 97.

Acousto-optical modulators 99 are disposed in the joint focal plane of the spherical facets 96 and 97. The modulators 99 in FIG. 5 correspond to the modulators 14 in FIG. 1. By including the modulators 99, the intensities of the light beams converging between the conjugate pairs of facets in the two active mirrors 43' and 43" may be modulated individually by the computer 31. The refractive powers and orientations of the mirror facets 96 and 97 may be adjusted by voltage on the control electrodes of the active mirrors 43', 43" as shown in FIG. 4 and described above.

In this way, a linear, or a substantially linear, arrangement of densely adjoining focal spots may be provided in the y-direction. The distance between such spots may be substantially one half of the diameter of the focal spot. Thus, by including the arrangement shown in FIG. 5, the system 10 may be operated with several channels each having its own laser spot and each co-ordinated in operation with the other channels to scan in the x-direction and the y-direction in the manner described above with respect to the system shown in FIG. 1. This causes the operation frequency of the system 10 to be increased by a factor corresponding to the number of the illumination channels. For example, the frequency of the system shown in FIG. 1 may be increased from approximately forty megahertz (40 mhz) to approximately one hundred and twenty megahertz (120 mhz) by including the arrangement of the active mirrors 43' and 43" shown in FIG. 3.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination for inscribing a pattern on a photoresist layer on a substrate,
    means for providing a beam of energy having first characteristics,
    means for focussing on the photoresist layer the beam of energy having the first characteristics for reflection of such energy in accordance with the characteristics of such photoresist layer at the position of focus on the photoresist layer,
    means for producing a scanning of the beam relative to the photoresist layer in a raster scan represented by progressive lines each extending in a first direction and displaced from each other in a second direction co-ordinate with the first direction,
    means for providing an indication, in the scanning of the energy beam, of the scanning of particular positions in progressive lines by the energy beam,
    means for providing markers representing particular positions in the progressive lines being scanned, and
    means for adjusting the rate of scanning of the energy beam in the progressive lines in accordance with any differences between the scanning of the particular positions in the progressive lines and the production of the markers representing the particular positions in the progressive lines.

2. In a combination as set forth in claim 1, means for providing a physical movement of the substrate in a second direction co-cordinate with the first direction, and means for providing a scanning, concurrently with the physical movement of the substrate in the second direction of the energy beam through a limited distance in the first direction less than the complete distance of the pattern inscribed on the photoresist layer in the first direction.

3. In a combination as set forth in claim 2, means for concurrently providing a plurality of energy beams displaced from one another in the second direction, and means for simultaneously displacing the plurality of energy beams in the first direction.

4. In a combination as set forth in claim 3, means responsive to the energy reflected from the photoresist layer for adjusting the focus of the energy beam on the photoresist layer.

5. In combination for inscribing a pattern on a photoresist layer on a substrate, means for providing a first energy beam having first characteristics, means for focussing the first energy beam on the photoresist layer of the substrate to obtain an inscribing of the photoresist layer and a reflection of the beam from the substrate, means for producing a scanning of the first energy beam relative to the substrate at a first rate, means for modulating the intensity of the first energy beam during the scanning of the first energy beam relative to the substrate at the particular rate to control the pattern inscribed on the photoresist layer, means responsive to the energy reflected in the first energy beam from the photoresist layer for regulating the scanning of the first energy beam at the first rate, means for providing a second energy beam co-ordinated in scanning with the first energy beam and having second characteristics different from the first characteristics, means for producing a scanning of the second energy beam at a second rate different from the first rate, means for focussing the second energy beam on the photoresist layer of the substrate to obtain a reflection of the energy in the second energy beam from the photoresist layer on the substrate in accordance with the pattern inscribed on the substrate, and means for using the energy reflected in the second energy beam from the photoresist layer of the substrate at individual positions in the substrate to enhance the focussing of the first energy beam on the substrate at such individual positions.

6. The combination as set forth in claim 5 wherein the scanning means produces a scanning of the energy in the first energy beam in progressive lines of limited displacement in a first direction and a displacement of the progressive lines from each other in a second direction.

7. In combination for inscribing a pattern on a photoresist layer on a substrate, means for providing a first energy beam having first characteristics, means for focussing the first energy beam on the photoresist layer of the substrate to obtain an inscribing of the photoresist layer and a reflection of the beam from the substrate, means for producing a scanning of the first energy beam relative to the substrate, means for modulating the intensity of the first energy beam during the scanning to control the pattern inscribed on the photoresist layer, means responsive to the energy reflected in the first energy beam from the photoresist layer for regulating the scanning of the first energy beam, means for providing a second energy beam co-ordinated in scanning with the first energy beam and having second characteristics different from the first characteristics, means for focussing the second energy beam on the photoresist layer of the substrate to obtain a reflection of the energy in the second energy beam from the photoresist layer on the substrate in accordance with the pattern inscribed on the substrate, means for using the energy reflected in the second energy beam from the photoresist layer of the substrate to enhance the focussing of the first energy beam on the substrate, the focus-enhancing means including an active mirror, means for providing an ideal point-spread function of the first beam, means responsive to the energy reflected in the second energy beam from the photoresist layer for providing an actual point-spread function of the energy, and means responsive to the relative characteristics of the ideal and actual point-spread functions for adjusting the active mirror to have the actual point-spread function approach coincidence with the ideal point-spread function.

8. In a combination as set forth in claim 7, means for moving the substrate in the first and second co-ordinate directions concurrently with the scanning of the first energy beam in the first and second co-ordinate directions.

9. In a combination as set forth in claim 8, the first energy beam having a first wavelength and the second energy beam having a second wavelength different from the first wavelength and the energy constituting light.

10. In combination for inscribing a pattern on a photoresist layer on a substrate, means for providing a beam of energy, means for operating upon the beam of energy to provide a plurality of beams of energy displaced from each other in a particular direction, means for directing the beams of energy in the plurality toward the photoresist layer on the substrate, means for focussing the beams of energy in the plurality on the photoresist layer on the substrate, means for simultaneously obtaining a scan of the beams of energy in the plurality in the particular direction and in a second direction co-ordinate with the particular direction to obtain a raster scan of the beams of energy, and means for modulating the beams of energy in the plurality during the raster scan to inscribe the pattern on the photoresist layer on the substrate.

11. In a combination as set forth in claim 10, including, means for providing a movement of the substrate relative to the beams of energy in the particular and second directions, the means for providing the raster scan of the beams of energy in the plurality relative to the substrate providing movement of the beams of energy in the particular and second directions.

12. In a combination as set forth in claim 10,
means for providing an indication of a desired positioning of the energy beams in the plurality at periodic times, and
means responsive to the indications of the desired positioning of the energy beams in the plurality in the particular direction at the periodic times and to the actual positioning of the energy beams in the plurality at such periodic times for simultaneously adjusting the rate at which the beams in the plurality are scanned by the scanning means in accordance with any differences between such desired and actual positionings.

13. In a combination as set forth in claim 10,
means for providing a scanning of the photoresist layer on the substrate with an additional energy beam different from the energy beams in the plurality to obtain a reflection of the positions in the layer in accordance with the characteristics of the photoresist layer at such individual positions, and additional energy beam from the photoresist layer at the individual positions in the photoresist layer for maintaining the energy beams in the plurality focussed on the photoresist layer at such individual positions.

14. In combination for inscribing a pattern on a photoresist layer on a substrate,
means for providing a beam of energy,
means for operating upon the beam of energy to provide a plurality of beams of energy displaced from each other in a particular direction,
means for directing the beams of energy in the plurality toward the photoresist layer on the substrate,
means for focussing the beams of energy in the plurality on the photoresist layer on the substrate,
means for obtaining a scan of the beams of energy in the plurality in the particular direction and in a second direction co-ordinate with the particular direction to obtain a raster scan of the beams of energy,
means for modulating the beams of energy in the plurality during the raster scan to inscribe the pattern on the photoresist layer on the substrate,
means for providing an indication of a desired positioning of the energy beams in the plurality at periodic times,
means responsive to the indications of the desired positioning of the energy beams in the plurality in the particular direction at the periodic times and to the actual positioning of the energy beams in the plurality at such periodic times for simultaneously adjusting the rate at which the beams in the plurality are scanned by the scanning means in accordance with any difference between such desired and actual positioning,
means for directing to the photoresist layer an additional energy beam having characteristics different from those in the energy beams in the plurality to obtain a reflection of the energy in such beam from the photoresist layer,
means responsive to the energy reflected from the photoresist layer in the additional beam for detecting such energy, and
means responsive to the energy detected in the second beam for maintaining the energy beams in the plurality focussed on the photoresist layer.

15. In a combination as set forth in claim 14,
an active mirror adjustable in a plurality of different positions,
the active mirror being adjustable in the different positions in accordance with the energy detected in the additional beam to maintain the energy beams in the plurality focussed on the photoresist layer.

16. In combination for inscribing a pattern on a photoresist layer on a substrate,
means for providing a beam of energy,
means for focussing the beam of energy on the substrate in a spot size defined by particular external dimensions,
means for providing a movement of the substrate in first and second co-ordinate directions, and
means for providing a raster scan of the energy beam in the first direction through limited and progressive positions having dimensions less than the dimension of the pattern of the photoresist layer in the first direction and for simultaneously providing a raster scan of the energy beam in a second direction coordinate with the first direction, and
means for modulating the energy beam, in accordance with the pattern to be inscribed on the photoresist layer, during the scan of the energy beam in the first direction through the limited and progressive positions in the first direction and through the simultaneous and repetitive scans in the second direction.

17. In a combination as set forth in claim 16,
the energy beam directed to the photoresist layer being reflected from the photoresist layer,
means responsive to the energy beam reflected from the photoresist layer for producing first signals having characteristics representative of such energy beam at the individual positions on the photoresist layer,
means for providing a second energy beam having characteristics different from the first energy beam,
means for providing a scanning of the second energy beam in the first and second coordinate directions to obtain a reflection of the second energy beam from the photoresist layer of the substrate,
means responsive to the reflection of the second energy beam from the photoresist layer for producing second signals representing such reflection,
means for providing signals representing a desired focussing of the energy beam on the photoresist layer, and
means responsive to any differences between the signals representing the desired focussing of the energy beam and the signals representing the reflected second energy beam for the individual positions on the photoresist layer for adjusting the characteristics of the first energy beam at such indivdual positions to minimize any such differences at such individual positions.

18. In a combination as set forth in claim 16,
the adjusting means including a plurality of elements each constructed to provide a focussing action on an individual portion of the energy beam, and
the adjusting means further including means operative on the different ones of the elements in the plurality to produce the focussing of the energy beam on the photoresist layer in accordance with any differences between representing the desired focussing of the energy beam and the signals representing the reflected second energy beam.

19. In a combination as set forth in claim 16,
means for providing marker signals representing a particular position in each limited and progressive line scan of the energy beam in the first direction, and
means responsive to the marker signals and the signals representing the scan of the energy beam past the paritcular position in the first direction for adjusting the rate of the scan to obtain a coincidence between the occureence of the marker signals and the scanning of the energy beam past the particular position in each line in the first direction.

20. In combination for inscribing a pattern on a photoresist layer on a substrate,
means for providing a first energy beam having first characteristics,
means for operating upon the first energy beam to convert the first energy beam into a plurality of beams displaced from one another in a first direction,
means for obtaining a scan of the energy beams in the plurality in the first direction through successive lines displaced from one another in a second direction co-ordinate with the first direction,
means for modulating the energy beams in the plurality, during the scanning of the successive lines, to inscribe the pattern on the photoresist layer,
means for providing a second energy beam having second characteristics,
means for obtaining a scan of the second energy beam asynchronously with the scan of the first energy beam to obtain a reflection of energy in the second beam from the photoresist layer in accordance with the pattern inscribed on the photoresist layer, and
means responsive to the reflected energy in the second beam for adjusting the focus of the energy beams in the plurality on the photoresist layer.

21. In a combination as set forth in claim 20,
means for regulating the scanning of the energy beams in the plurality to maintain the scanning of the energy beams in the plurality at a particular rate.

22. In a combination as set forth in claim 21,
the focussing means for the energy beams in the plurality including an active mirror having a plurality of elements and further including means responsive to the energy reflected in the second beam from the photoresist layer for individually activating the elements in the plurality to provide for the focussing fo the energy beam in the plurality on the photoresist layer.

23. In a combination as set forth in claim 20,
means for providing signals indicating the desired timing in the scanning of the energy beams in the plurality past a particular position in the first direction,
means for detecting the energy reflected from the photoresist layer in one of the beams in the plurality.
means responsive to the reflected energy for indicating the actual timing in the scanning of the energy beam in the plurality past the particular position in the first direction, and
means responsive to any differences in the timing of the signals representing the desired and actual timing in the scanning of the energy beams in the plurality past the particular position in the first direction for adjusting the rate of scanning of the energy beams in the plurality to compensate for any such differences in timing.

24. In a combination as set forth in claim 23,
the means converting the first energy beam into the energy beams in the plurality including a pair of active mirrors each including a plurality of spherical facets, individual ones of the spherical facets on the first active mirror being associated with individual ones of the spherical facets on the second active mirror to provide pairs of associated spherical facets and to provide a converging of energy from one of the associated spherical facets in each pair on the other one of the associated spherical facets in each pair.

25. A method of inscribing a pattern on a photoresist layer on a substrate, including the steps of:
providing a plurality of energy beams displaced from one another in a first direction,
simultaneously scanning the energy beams in the plurality in a second direction coordinate with the first direction through a plurality of lines displaced from one another in the first direction,
focussing the energy beams in the plurality on the photoresist layer, and
simultaneously modulating the energy beams in the plurality at progressive instants of time in accordance with the pattern to be inscribed on the photoresist layer in the second direction.

26. A method as set forth in claim 25, including the step of:
producing the energy beams in the plurality by providing a single beam of energy and dividing the beam of energy into the energy beams in the plurality.

27. A method as set forth in claim 25 including the step of:
moving the substrate in the first and second co-ordinate directions, and
simultaneously scanning the energy beams in the plurality in the second direction through limited and progressive positions defining a distance less than the distance of the pattern in the second direction while providing a movement of the substrate in the first direction.

28. A method of inscribing a pattern on a photoresist layer on a substrate, including the steps of:
providing a first energy beam,
directing the energy beam to the photoresist layer,
scanning the first energy beam in a first direction in lines displaced from one another in a second direction co-ordinate with the first direction;
modulating the first energy beam, during the scanning of the first energy beam, in accordance with the pattern to be inscribed on the photoresist layer,
focussing the first energy beam on the photoresist layer,
providing a second energy beam having characteristics different from those of the first energy beam,
directing the second energy beam to the photoresist layer for reflection by the photoresist layer,
scanning the second energy beam asynchronously with the first energy beam,
focussing the second energy beam on the photoresist layer, and operating upon the energy reflected from the photoresist layer in the second beam to adjust the focussing of the first energy beam on the photoresist layer.

29. In a method as set forth in claim 28,
the energy in the first beam constituting light at a first wavelength and the energy in the second beam constituting light at a second wavelength different from the first wavelength.

30. A method as set forth in claim 29, including the step of:
synchronizing the scanning of the first beam to obtain the scanning of the successive lines in the first direction at pre-set time intervals.

31. A method as set forth in claim 30, including the step of:
dividing the first energy beam into a plurality of energy beams,
and providing for the synchronous scanning of the energy beams in the plurality.

32. In combination for inscribing a pattern on a photoresist layer on a substrate,
means for providing a first energy beam,
means for directing the first energy beam to the photoresist layer of the substrate to obtain an inscribing of the photoresist layer and a reflection of the beam from the photoresist layer,
means for modulating the first energy beam in accordance with the pattern to be inscribed on the substrate,
means for producing a scanning of the first energy beam on the substrate at a first rate,
means responsive to the energy reflected from the substrate in the first energy beam for regulating the scanning of the first energy beam to maintain the first rate,
means for providing a second energy beam,
means for providing a scanning of the second energy beam at a second rate different from the first rate,
means for directing the second energy beam to the photoresist layer of the substrate to obtain a reflection of the second energy beam from the photoresist layer,
means responsive to the energy reflected from the substrate in the second energy beam for regulating the scanning of the second energy beam to maintain the second rate, and
means responsive to the reflection of the second beam from the photoresist layer at individual positions on the photoresist layer for adjusting the characteristics of the first energy beam at such individual positions to maintain the first energy beam focussed on the photoresist layer.

33. In a combination as recited in claim 32,
the scanning means for the first energy beam providing a first marker at specified positions in the scan,
means for providing a first reference signal at spaced time intervals in the first scan,
means responsive to the relative times of production of the first marker and the first reference signal for adjusting the rate of the scan of the first energy beam to minimize any difference in the time between the production of the first marker and the production of the first reference signal,
the scanning means for the second energy beam providing a second marker at specified positions in the scan,
means for providing a second reference signal at spaced time intervals in the second scan, and
means responsive to the relative times of production of the second marker and the second reference signal to minimize any difference in the time between the production of such second marker and of such second reference signal.

34. In a combination as recited in claim 32,
the adjusting means including an active mirror having a plurality of elements individually adjustable to adjust the characteristics of the first energy beam at such positions.

35. In a combination as set forth in claim 32,
means for dividing the first energy beam into a plurality of energy beams displaced from one another in a first direction and movable by the associated scanning means in a second direction coordinate with the first direction.

36. In combination for inscribing a pattern on a photoresist layer on a substrate,
means for providing a first energy beam,
means for directing the first energy beam to the photoresist layer of the substrate to obtain an inscribing of the photoresist layer and a reflection of the beam from the photoresist layer,
means for modulating the first energy beam in accordance with the pattern to be inscribed on the substrate,
means for deriving from the reflected beam a point-spread function of the photoresist layer at individual positions on the layer, and
means for adjusting the characteristics of the beam at the individual positions on the photoresist layer in accordance with the chracterisitics of the point-spread function at such individual positions.

37. In a combination as set forth in claim 36,
the adjusting means including an active mirror having a plurality of elements each adjustable to adjust the characteristics of the energy beam at an individual position on the photoresist layer.

38. In a combination as set forth in claim 36,
means disposed relative to the photoresist layer for focussing the energy beam at a particular distance from the photoresist layer,
means for detecting the reflected light, and
means disposed relative to the detecting means for focussing the energy beam at the particular distance from the detecting means.

39. In combination as set forth in claim 36,
the scanning means providing a scan of the energy beam in a first direction relative to the photoresist layer, and
means for providing a movement of the substrate in a second direction coordinate with the first direction.

40. In a combination as set forth in claim 38,
the scanning means providing a scan of the energy beam relative to the photoresist layer in a first direction through progressive positions defining a distance significantly less than the distance of the pattern in the first direction, and
means for providing a movement of the substrate in a second direction coordinate with the first direction through a distance corresponding to the distance of the pattern in the second direction and for then moving the substrate in the first direction through a distance defined by the progressive positions of the scan in the first direction.

* * * * *